United States Patent
Lu et al.

(10) Patent No.: US 7,166,924 B2
(45) Date of Patent: Jan. 23, 2007

(54) ELECTRONIC PACKAGES WITH DICE LANDED ON WIRE BONDS

(75) Inventors: Jicun Lu, Rancho Cordova, CA (US); Charles A. Gealer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 187 days.

(21) Appl. No.: 10/921,014

(22) Filed: Aug. 17, 2004

(65) Prior Publication Data

US 2006/0038273 A1 Feb. 23, 2006

(51) Int. Cl.
*H01L 23/48* (2006.01)
(52) U.S. Cl. .................................. 257/777
(58) Field of Classification Search .............. 257/777
See application file for complete search history.

(56) References Cited

U.S. PATENT DOCUMENTS

| | | | | |
|---|---|---|---|---|
| 5,291,061 A | * | 3/1994 | Ball | 257/686 |
| 6,176,417 B1 | * | 1/2001 | Tsai et al. | 228/180.5 |
| 6,222,259 B1 | * | 4/2001 | Park et al. | 257/690 |
| 6,333,562 B1 | * | 12/2001 | Lin | 257/777 |
| 6,388,313 B1 | * | 5/2002 | Lee et al. | 257/686 |
| 6,531,784 B1 | * | 3/2003 | Shim et al. | 257/777 |
| 6,630,744 B1 | | 10/2003 | Tsuda | |
| 6,650,006 B1 | | 11/2003 | Huang et al. | |
| 6,696,320 B1 | | 2/2004 | Gacusan | |
| 6,717,251 B1 | | 4/2004 | Matsuo et al. | |
| 6,870,269 B1 | * | 3/2005 | Derderian | 257/777 |
| 2002/0125556 A1 | * | 9/2002 | Oh et al. | 257/685 |
| 2002/0180025 A1 | * | 12/2002 | Miyata et al. | 257/690 |
| 2004/0084760 A1 | * | 5/2004 | Liu et al. | 257/686 |
| 2004/0084771 A1 | * | 5/2004 | Bolken et al. | 257/738 |

OTHER PUBLICATIONS

J. Robert Lineback, Tessera—with Intel—introduces 'folded' stacked -chip packages, webpage located at www.siliconstrategies.com/article, 2 pages, May 2004.

Author unknown, Wire Bonded Stacked Chips, webpage located at www.eleceng.adelaide.edu.au/Personal/alsarawi/node35.html, 2 pages, May 2004.

\* cited by examiner

*Primary Examiner*—Lex H. Malsawma
(74) *Attorney, Agent, or Firm*—Schwabe, Williamson & Wyatt, P.C.

(57) ABSTRACT

A stacked dice electronic package without spacers between the dice and where an overlying die is landed on wire bonds of the underlying die is disclosed.

20 Claims, 8 Drawing Sheets

400

500

1000

ELECTRONIC PACKAGES WITH DICE LANDED ON WIRE BONDS

BACKGROUND OF THE INVENTION

1. Field of the Invention

Embodiments of the present invention relate to, but are not limited to, electronic devices, and in particular, to the field of electronic device packaging.

2. Description of Related Art

As electronic equipment such as laptops and mobile phones become smaller, electronic packages that may be contained in these devices are likewise becoming smaller. One approach for reducing the size of electronic packages includes stacking two or more chips or dice in these packages. Each of these dice may be, for example, a processor, input/output device, graphical co-processor, a digital signal processor, nonvolatile and/or volatile memory, and the like.

In some situations, the stacked dice are spaced apart for various reasons including, for example, to prevent wire bonds that may couple an underlying die to a package substrate from being damaged by the overlying die or preventing the dice from being in direct contact with each other. In stacked-chip packages in which at least the same size or bigger die is placed on top of another smaller or equal-sized die, spacers are typically placed between the dice to maintain a certain gap between the dice.

FIG. 1 depicts a conventional electronic package with multi-stacked chips or dice. In this electronic package 100, a first die 102 and a second die 104 are stacked on top of a substrate 106. Each of the dice 102 and 104 is electrically coupled to the substrate 106 via wire bonds 108. The first die 102 is further coupled to the substrate (or die) via an adhesive 110. The second die 104 is coupled to the first die via adhesives 112 and a spacer, in this case, a plate spacer 114. Note that in this electronic package, the first die 102 is smaller than the second die 104. That is, the second die 104 having about the same size (may even be slightly smaller) or bigger than the first die 102 relative to at least one lateral or horizontal direction (i.e., parallel to the first and second die surfaces 115), the same direction, for example, where wire bonds 108 are attached to the first die 102. Although not depicted in FIG. 1, circuitry components such as transistors are typically located in the central portion of the active (top) surfaces of the first and second dice 102 and 104 while the peripheral portions of the active surfaces are typically dedicated to bonding pads and bond wires. The spacer 114 and adhesives 112, in this electronic package 100, assures that there is sufficient space between the first and second dice so that the wire bonds of the first die do not come in contact with the second die. The spacer 114 may be comprised of silicon or organic material such as a polyimide.

FIG. 2 depicts another electronic package with multi-stacked chips or dice. However, in this electronic package 200, instead of a plate spacer, spherical spacers 202 are employed to assure that the two dice maintain sufficient separating space. Such spacers 202 in adhesive 112 are typically placed at the central portion of the active surface 204 of the first die 102 away from the periphery of the active surface 204 where the wire bonds 108 are generally coupled to the first die 102. The spherical spacers 202 may be made of polymer materials to prevent damage to the active surface of the first die 102.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Figure 1:
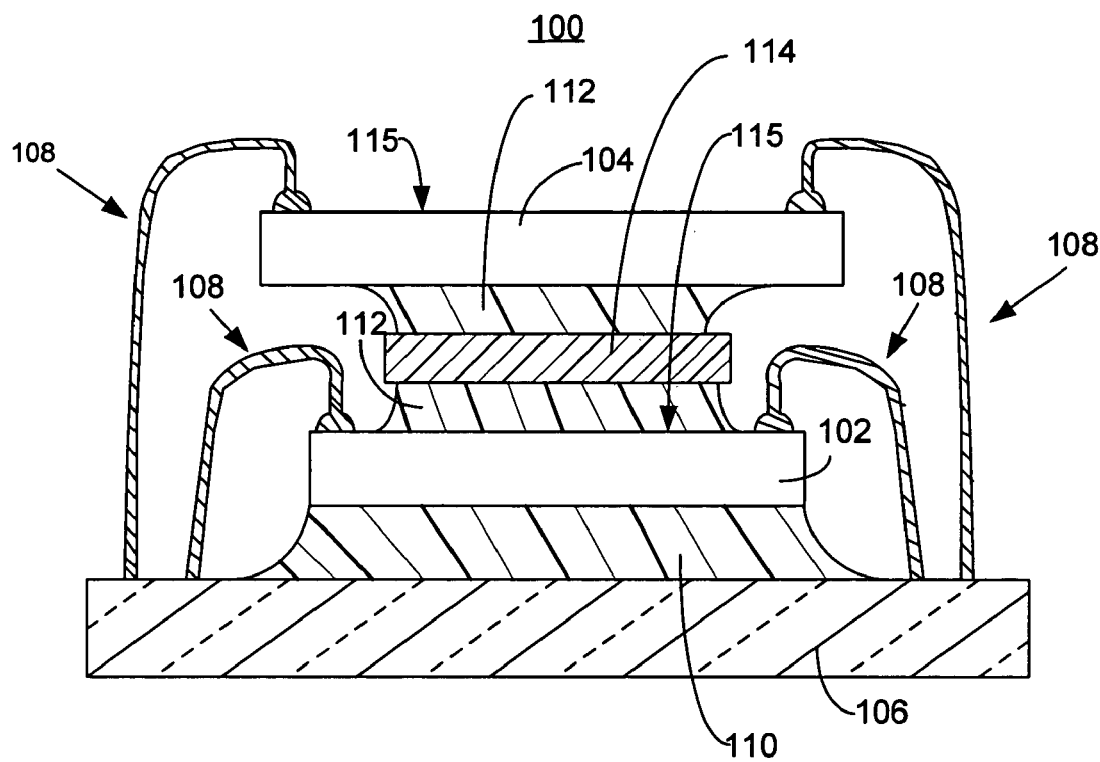
FIG. 1 illustrates a conventional electronic stacked die package with plate spacer(s)
Figure 2:
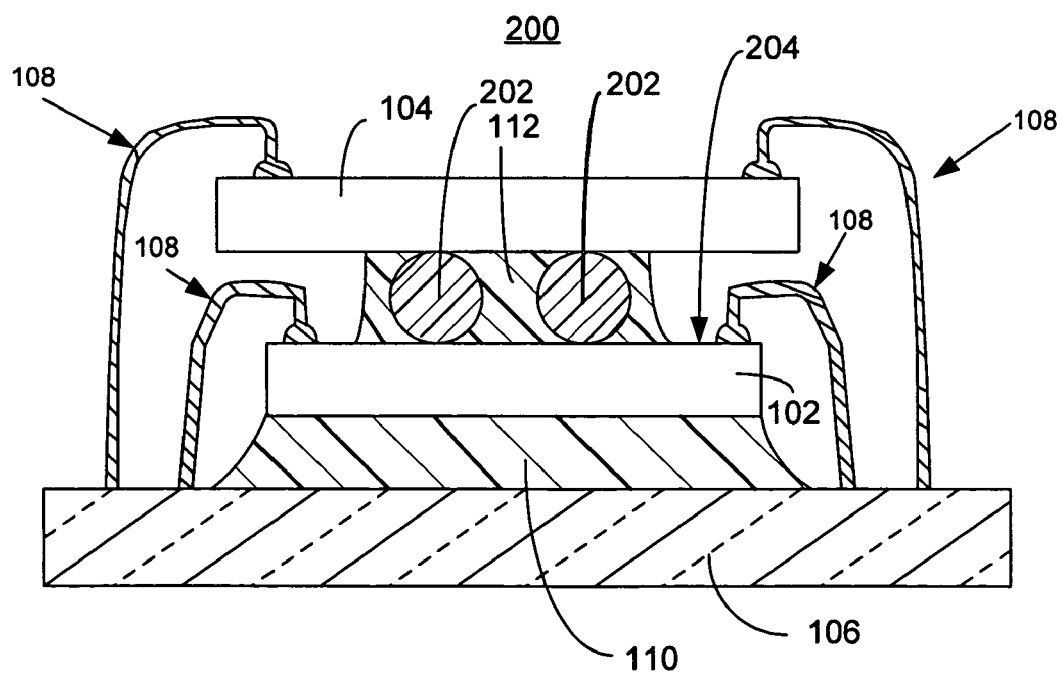
FIG. 2 illustrates another conventional electronic stacked die package with spherical spacers.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

The following description includes terms such as on, onto, on top, vertical, horizontal, downward, and the like, that are used for descriptive purposes only and are not to be construed as limiting. That is, these terms are terms that are relative only to a point of reference and are not meant to be interpreted as limitations but are instead, included in the following description to facilitate understanding of the various aspects of the invention.

According to various embodiments of the invention, electronic packages are provided that includes stacked chips or dice without spacers. For these embodiments, a top die may be directly landed on top of the wire bonds of a bottom die. By eliminating spacers, such packages may be made thinner and may require less manufacturing processes. In various embodiments, the electronic package may be, for example, a semiconductor package. The semiconductor package may include two or more dice or chips stacked one on top of another and without spacers between the two or more dice or chips. For the embodiments, the electronic package may include a first die on a substrate, the first die having a first active surface with circuitry, such as transistors, opposite of the substrate. In various embodiments, the substrate may be a carrier or package substrate while in other embodiments the substrate may be an underlying die. A plurality of wire bonds may be disposed on top of the first surface of the first die. In various embodiments, the plurality of wire bonds may be coupled to the first surface at the periphery of the first surface. A second active surface of a second die may be directly landed on the plurality of wire bonds on top of the first surface of the first die. In various embodiments, at least the portion of the second surface of the second die that contacts the wire bonds may be comprised of electrical insulating material. In other embodiments, however, the second surface of the second die may not be comprised of electrical insulating material. In some embodiments, a layer of adhesive material may be disposed between the first and second dice and bond the dice together.

In various embodiments, the second or overlying die is at least as large as the first or underlying die in at least one direction. That is, for these embodiments, the second surface of the second die may be dimensioned so that in at least one horizontal or lateral direction, the second surface of the second die is about or bigger than the first surface of the first die. In other embodiments, the second die may actually be smaller at least in terms of surface area than the first die. For these embodiments, the wire bonds may be coupled to the periphery or the central portions of the first surface of the first die.

In some embodiments, the wire bonds may be detached wire bonds that form stud bumps. For these embodiments, the stud bumps may be located at the periphery of the top surface of the first die. In various embodiments, the wire bonds may have sufficient structural integrity to assure that a gap is present between the first and second dice.

Figure 3A:
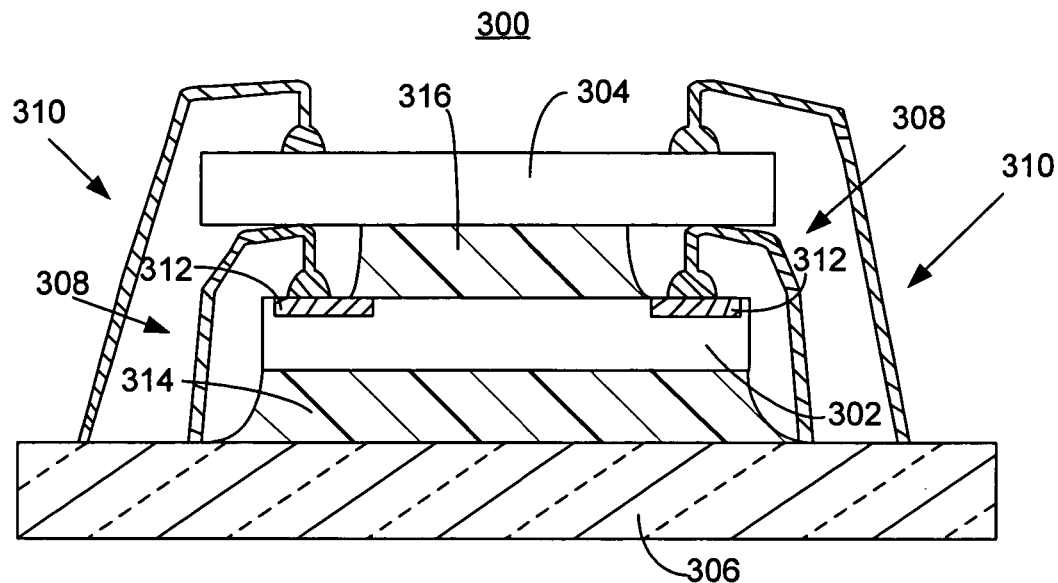
FIG. 3A illustrates a stacked die package having an overlying die that is directly landed on normal wire ball bonds of the underlying die in accordance with some embodiments.

FIG. 3A depicts an electronic package, in this case a stacked-chip (die) package, with normal ball bond wiring and without spacers according to some embodiments. For the embodiments, the electronic package 300 includes a first die 302 and a second die 304 stacked on top of a substrate 306. The second die 304 is sized about the same or larger than the first die 302 in at least one lateral or horizontal direction. The first die 302 is electrically coupled to the substrate 306 via first wire bonds 308. The second die 304 is electrically coupled to the substrate 306 via second wire bonds 310. Each of the first wire bonds 308 is coupled to the first die 302 via bond pads 312. A first layer of adhesive material ("first adhesive layer") 314 joins or couples the first die 302 to the substrate 306. A second layer of adhesive material ("second adhesive layer") 316 joins the second die 304 directly to the first die 302. The direct joining or coupling of the first and second dice 302 and 304 means that, in some embodiments, the size of the overall electronic package 300 may be reduced from those electronic packages that include spacers. For these embodiments, the second die 304 is directly landed on one or more of the tops of the first wire bonds 308. In some embodiments, there may be a small gap between some of the first wire bonds 308 and the second die 304 such as when the wire bonds 308 have variable heights and/or the first adhesive 316 has sufficient height and mechanical or structural strength to at least partially or fully support the second die 304. In various embodiments, the electronic package may be a 1.4, 1.2, 1.0 or 0.8 mm thick stacked package with chips or dice having a thickness of about 50 microns to 200 microns.

In various embodiments, the substrate 306 may be a carrier or package substrate. In other embodiments, however, the substrate 306 may be a third die that may be directly coupled or bonded to the first wire bonds 308 as depicted in FIG. 3A. In yet other embodiments, however, the first wire bonds 308 may not be coupled or bonded to the third die (i.e., substrate 306) but instead, may be coupled or bonded to an underlying substrate (not shown) as will be described below.

Figure 3B:
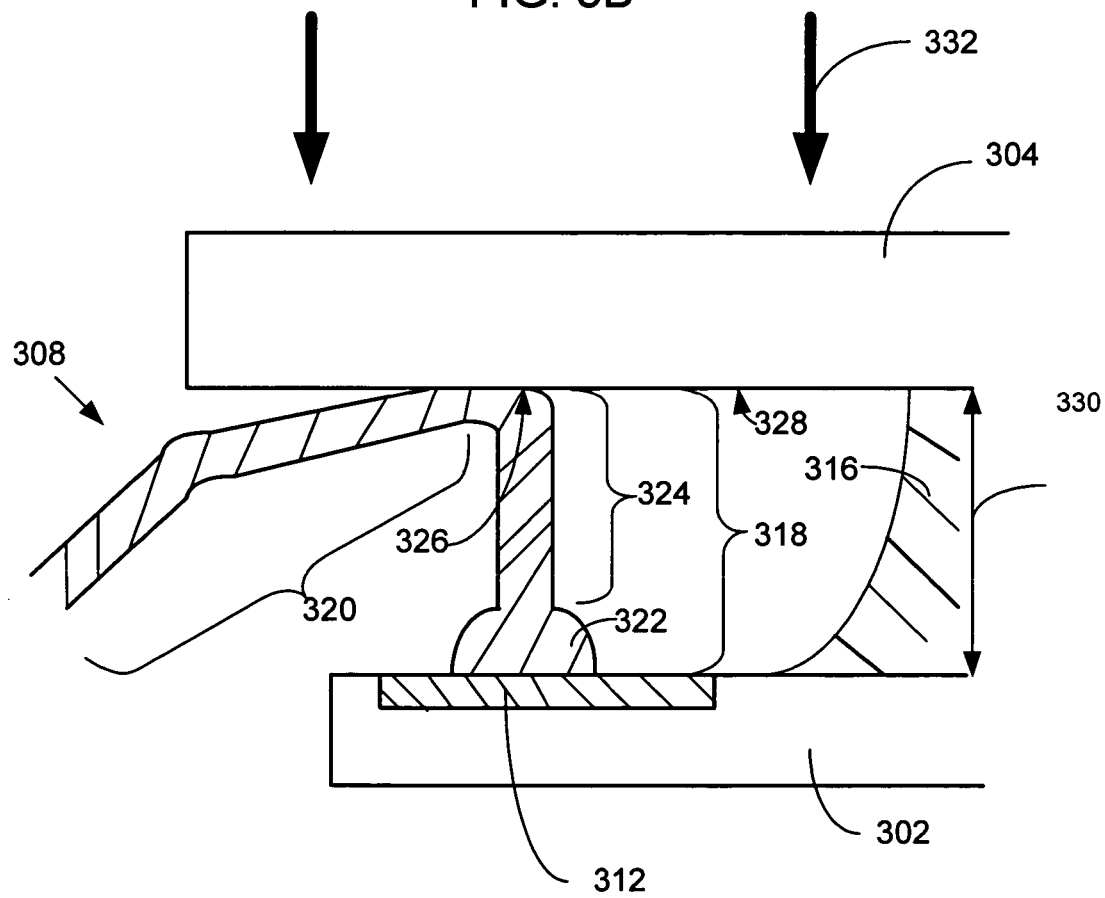
FIG. 3B illustrates a wire bond of FIG. 3A, in further detail, in accordance with some embodiments.

FIG. 3B depicts in further detail the coupling of one of the first wire bonds 308 (i.e., standard bond wiring) to the first die 302 and the direct landing of the second die 304 onto the wire bonds 308 of FIG. 3A in accordance with some embodiments. For the embodiments, each of the first wire bonds 308 comprises of a bond portion 318 and a wire portion 320. The bond portion 318 further includes a bond bump 322 and, because this is normal ball bond wiring, a vertical wire shaft 324 that protrudes vertically up from the bond bump 322. In various embodiments, the bond bump 322 having a thicker width than the vertical wire shaft 324. The portion of the first wire bond 308 above the bond bump 322 (which includes the vertical wire shaft 324) is sometimes referred to as a loop. Note that in other embodiments described below, the first wire bonds 308 may only include the bond portion 318 or portions thereof without the wire portion 320 thus forming a detached wire bonds or stud bumps.

For the embodiments, the first wire bonds 308 are in contact with the second die 304. In particular, the highest points (e.g., ref. 326 in FIG. 3B) of the first wire bonds 308 are in contact with the bottom surface 328 of the second die 304. Even the highest points are parts of the wire bonds 308. For these embodiments, the wire bonds 308 may be adapted so as to not deform in the horizontal direction and cause electrical shorts between the neighboring wires (wire bonds).

In some embodiments, the substrate 306 may be a die, a package substrate such as a ball grid array (BGA) package substrate or a circuit board substrate. In various embodiments, the first and second dice 302 and 304 may have the side dimensions of about 0.2 mm to about 20 mm. In various embodiments, the gap 330 between the first and second dice 302 and 304 may be between about 50 microns to about 200 microns.

In various embodiments, some portions or the entire bottom surface 328 of the second die 304 may be coated with an electrical insulating material. For example, in various embodiments, at least the portions of the bottom surface 328 that will be in contact or coupled with the first wire bonds 308 may be coated with polymer materials such as polyimide, Benzocyclobutene (BCB), epoxy, and the like or inorganic materials such as Silicon Dioxide or Silicon Nitride. This may assure that an electrical short will not result when one or more of the wire bonds 308 makes contact with the bottom surface 328 of the second die 304. Alternatively, rather than coating the bottom surface 304 with an insulating material, in other embodiments, the second adhesive layer 316, which may be a dielectric, may be extended over the tops of the wire bonds 308. The resulting adhesive layer that is on top of the wire bonds 308 may therefore act as an insulating coating layer for the bottom surface 328 of the second die 304. Note that although the second adhesive layer 316 in FIGS. 3A and 3B are depicted as being not in contact with the first wire bonds 308, in various other embodiments the adhesive layer 316 may in fact be in contact or envelop the wire bonds 308, particularly when the second adhesive layer 316 comprises of a nonconductive dielectric material. The third approach is to coat the first wire bonds with a nonconductive layer (e.g. spray coating of a thin nonconductive polymer layer) prior to the placement of the second die 304. It should be noted that in some embodiments, there may be no need to coat the bottom surface 328 of the second die 304 with an insulting material. For example, in the case where the wire bonds 308 are detached wire bonds that form stud bumps (see FIGS. 6 to 8), there may be no need to insulate the bottom surface 328 of the second die 304. That is, if the wire bonds 308 are electrically isolated from other components, such as in the case where the wire bonds 308 are detached, then there may be no need to coat the bottom surface 328 of the second die 304 with insulating material.

In various embodiments, the weight of the second die 304 as well as any other downward forces (see ref. 332) that may be present during or after the electronic package 300 assembly process may be supported by the first wire bonds 308. That is, in addition to the weight of second die 304, other downward forces may be present throughout the manufacture of the electronic package 300 and afterwards (e.g., post-assembly). For example, one downward force that may be present during the manufacture of the electronic package 300 is the force on the second die 304 when it is placed on the second adhesive 316. A portion of the whole downward force may be used to force the second adhesive 316 to flow from the central portions of the first die 302 to the edges. Thus, less or no downward force may be applied on the wire bonds 308 of the first die 302 during the assembly process. Once the electronic package 300 has been assembled and finished, and the second adhesive layer 316 has solidified to some extent, the second adhesive layer 316 may provide structural support to the first wire bonds 308 in supporting the weight of the second die 304 and other downward die placement forces 332. In various embodiments, even if the second adhesive 316 shares or absorbs less of the force from the second die 304, the first wire bonds 308 may have sufficient structural integrity to support the weight of the second die 302 and downward die placement forces 332

In order to assure that the first wire bonds 308 have sufficient structural or mechanical integrity to support the weight of the second die 304, the forces caused by the second adhesive 316 and/or downward forces 332, several approaches may be used. For example, in some embodiments, the wire portion 320 may be made to be easily deformable with applied downward force. In such a situation, at least the wire shaft 324 and the bond bump 322 portion may be made to withstand high downward force. That is, the wire portion 320 may be adapted to be structurally weak and may bend in the horizontal direction upon exposure to downward force (e.g., downward force 332). However, as long as the wire shaft 324 and the bond bump 322 have sufficient structural integrity so that they do not collapse upon exposure to downward forces, the first wire bonds 308 will have sufficient structural integrity to support the weight of the second die 304, the forces caused by the second adhesive 316 and/or downward forces 332. In some embodiments, the first wire bonds 308 may have specific orientations and compositions. In these embodiments, the highest points 326 of the wires bonds 308 that will bore the initial downward force, may be located directly above the bonding pad 312. In particular, and as shown in FIG. 3B, each of the first wire bonds 308 may be coupled to and may extend substantially orthogonally away from a corresponding bonding pad 312 on the first die 302 such that a highest point 326 of the first wire bond 308 is disposed directly above the bonding pad 312. Further, in order for the highest point 326 of a first wire bond 308 to be located directly above the corresponding bonding pad 312, the first wire bond 308 may bend or turn greater than 90 degrees at the highest point 326.

In order to assure that the first wire bonds 308 have sufficient structural or mechanical integrity to support the weight of the second die 304, the forces caused by the second adhesive 316 and/or downward forces 332, several approaches may be used. For example, in some embodiments, the wire portion 320 may be made to be easily deformable with applied downward force. In such a situation, at least the wire shaft 324 and the bond bump 322 portion may be made to withstand high downward force. That is, the wire portion 320 may be adapted to be structurally weak and may bend in the horizontal direction upon exposure to downward force (e.g., downward force 332). However, as long as the wire shaft 324 and the bond bump 322 have sufficient structural integrity so that they do not collapse upon exposure to downward forces, the first wire bonds 308 will have sufficient structural integrity to support the weight of the second die 304, the forces caused by the second adhesive 316 and/or downward forces 332. In some embodiments, the first wire bonds 308 may have specific orientations and compositions. In these embodiments, the highest points 326 of the wires bonds 308 that will bore the initial downward force, may be located directly above the bonding pad 312. In particular, and as shown in FIG. 3B, each of the first wire bonds 308 may be coupled to and may extend substantially orthogonally away from a corresponding bonding pad 312 on the first die 302 such that a highest point 326 of the first wire bond 308 is disposed directly above the bonding pad 312. Further, in order for the highest point 326 of a first wire bond 308 to be located directly above the corresponding bonding pad 312, the first wire bond 308 may bend or turn greater than 90 degrees at the highest point 326.

In the embodiments depicted in FIG. 3B, the highest point of the first wire bond 308 is located at the top of the vertical wire shaft 324 as indicated by ref. 326. This may ensure that the downward force generated by the weight of the second die and any other downward force 332 encountered by the wire bonds 308 is directed downwards rather than laterally or in a horizontal direction (e.g., relative to, for example, the surface of the substrate 306). Otherwise, the downward force 332 may be redirected in a horizontal direction and may result in the wire bonds 308 moving in the horizontal direction since the wire bonds 308 may have less structural integrity in the horizontal direction than in the vertical direction (e.g., orthogonal to the surface of the substrate 306 and the surface of the first die 302). For example, a typical 25 um diameter gold wire (Sumitomo SGL2) has a Young's Modulus E of 7600 Kg/mm$^2$. The downward second placement force F may be about 50 gf to 400 gf depending on chip size (say 100 gf in this example). The weight of the second die 304 may be a smaller force. Also, the second die 304 may land on at least three wire bonds. As a result, the percentage of deformation or strain of the wire shaft 324 and bump 322 $\epsilon$ is:

$$\epsilon = (F/3 \text{ wire area})/E$$

$$= (100 \text{ g}/3 \times 3.14 \times (0.025/2)^2 \text{ mm}^2)/(7600 \text{ Kg/mm}^2)$$
$$\approx 0.9\%.$$

For gold wire, few percent of strain (typically <10%) is not sufficient to break the wire shaft 324 and bump 322.

In various embodiments, the thickness of the bond portion 318 (i.e., vertical wire shaft 324 and bond bump 322) may be made sufficiently thick to assure structural integrity. The minimum thickness of the bond portion 318 required to support the weight of the second die 304 along with the downward force 332 and/or downward force from the second adhesive 316 may depend upon several factors including, for example, the actual amount of the downward force 332 that may be encountered by the bond portion 318. In some embodiments, the bond portion 318 as well as the entire first wire bond 308 may have at least tensile elastic modulus of at least 60 GPa. For example, in various embodiments, the wire bond 308 may be comprised of gold, aluminum, and copper with tensile elastic modulus of 73.4 GPa, 64.5 Gpa, and 103.1 Gpa, respectively.

In various embodiments, the second adhesive layer 316 may be made of nonconductive material when, for example, the second adhesive layer 316 is in contact with the first wire bonds 308. In one embodiment, the material that comprises the second adhesive layer 316 is Dexter QMI 536HT manufactured by Loctite® with a viscosity (5 rpm/25C (cps)) of 13000. In various embodiments, the first die 308 may be at least as large (in terms of horizontal surface area) as the third die 322 (the first die may be bigger or smaller than the third die). Although each of the dice 302, 304 and 322 is depicted as being electrically coupled to the substrate 306 via wire bonds 308, 310 and 324, in other embodiments, one or more of the dice 302, 304 and 322 may not be electrically coupled to the substrate 306 but instead, may be coupled to another substrate or die. The substrate 306 may be a package or carrier substrate or may even be another die.

Figure 3C:
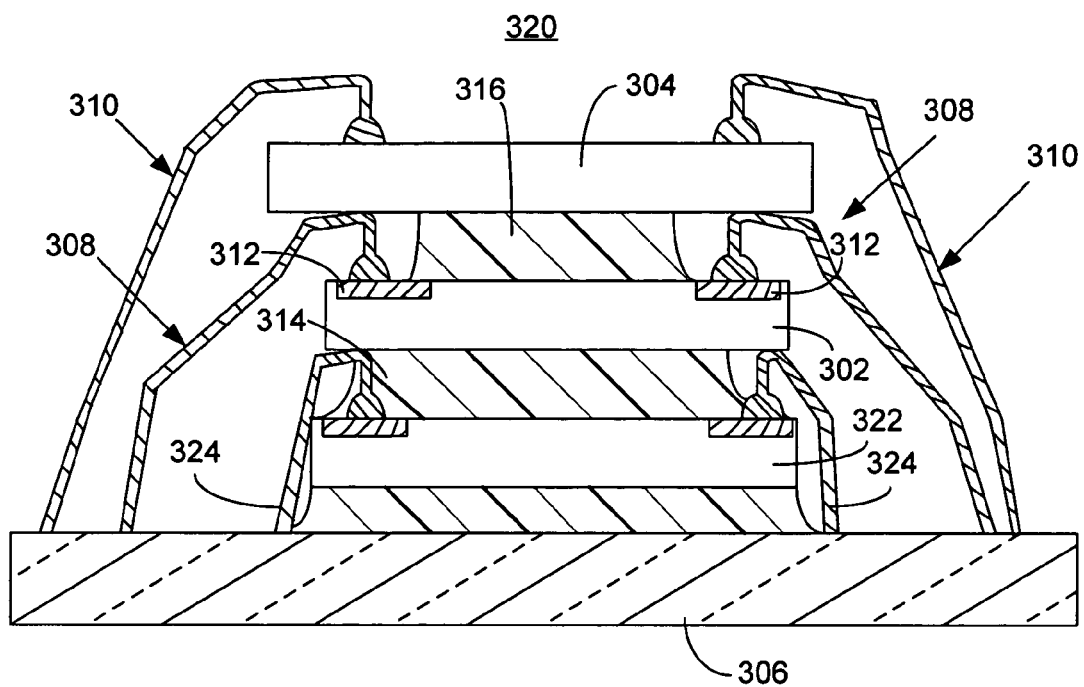
FIG. 3C illustrates a stacked-die package with three stacked dice and employing normal ball bond wiring without spacers in accordance with some embodiments.
Figure 4:
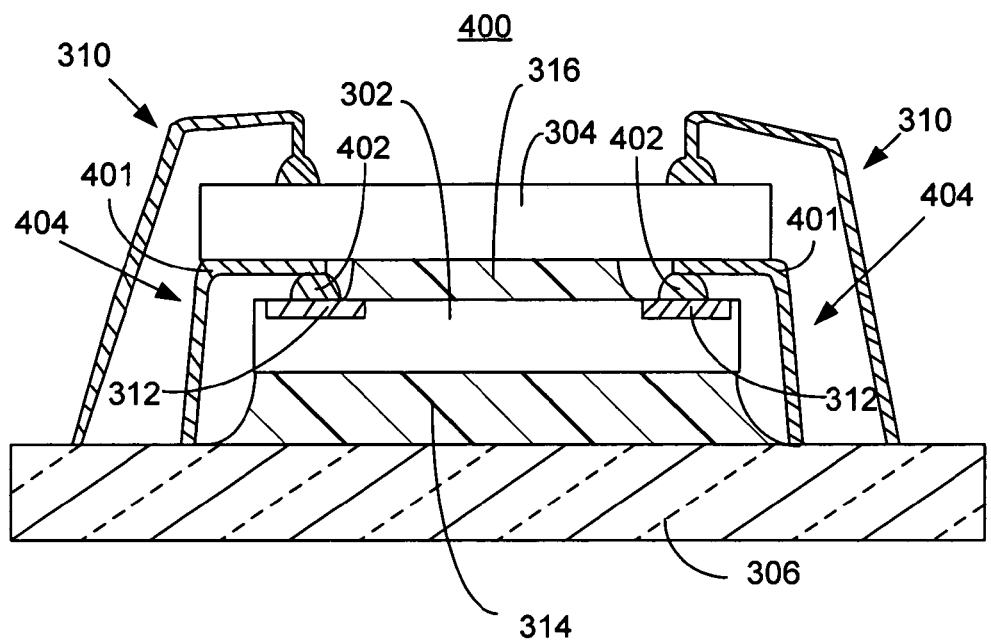
FIG. 4 illustrates a stacked die package having an overlying die that is directly landed on reverse ball bonds of the underlying die in accordance with some embodiments.

Referring to FIG. 4 depicting a stacked-chip (die) package with reverse wire bonding on the first die 302 and without spacers according to some embodiments. For the embodiments, the electronic package 400 includes a second die 304 that is directly landed onto first wire bonds 404. In particular, the first wire bonds 404, in this case, includes wire portions 401 and bond bumps 402. However, unlike the first wire bonds 308 in FIG. 3, the first wire bonds 404 here do not have vertical wire shafts. That is, the wire portions 401 of the first wire bonds 404 do not form a loop above the bond bumps 402. As a result, the gap between the two dice 302 and 304 is smaller than the gap of the two dice in FIG. 3A. A second adhesive layer 316 is disposed between the first and second dice 302 and 304 and directly joined to the surfaces of the dice 302 and 304.

For the embodiments, the gap between the two dice 302 and 304 may be as a result of the combination of bond bumps 402 and the sections of the wire portions 401 of the first wire bonds 404 immediately above the bond bumps 402. In some embodiments, the gap may also be at least partially due to the second adhesive layer 316 that is sandwiched between the two dice 302 and 304. Similar to the embodiments depicted in FIG. 3A, the bond bumps 402 may be designed to be of specific size (or volume) and composition so that the gap between the two dice 302 and 304 is maintained. For the embodiments, the bond bumps 402, the sections of the wire portions 401 immediately above the bond bumps 402 may have sufficient structural integrity to support the weight of the second die 304 as well as any additional downward force that may exist during the package assembly process or post-assembly. As in the previous embodiments, the substrate 306 may be a package substrate or a die.

Figure 5:
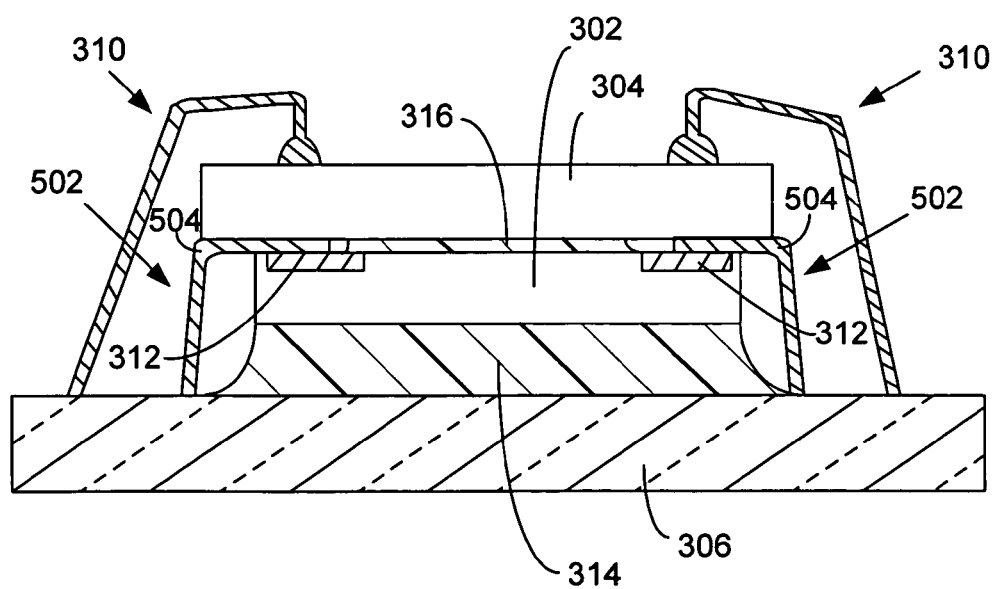
FIG. 5 illustrates a stacked die package having an overlying die that is directly landed on wedge wire bonds of the underlying die in accordance with some embodiments.

FIG. 5 depicts a stacked chip package with wedge wire bonding and without spacers according to some embodiments. For the embodiments, the electronic package 500 includes a second die 304 that is directly landed onto first wire wedge bonds ("wire bonds") 502. Unlike in the previous embodiments that are described above, for these embodiments, the first wire bonds 502 are comprised only of wire portions 504 and do not include bond bumps. The wire portions 504 are directly coupled to bonding pads 312. Because there are no bond bumps, the gap between the first and second dice 302 and 304 is even smaller than the gap depicted in FIG. 4. A second adhesive layer 316 is disposed between the first and second dice 302 and 304 and directly joined to the surfaces of the dice 302 and 304. As in the previous embodiments, the substrate 306 may be a package substrate or a die.

For the embodiments, the gap between the two dice 302 and 304 may be as a result of the sections of the wire portions 504 between the first and second dice 302 and 304. In some embodiments, the gap may also be at least partially due to the second adhesive layer 316 that is sandwiched between the two dice 302 and 304. The wire bonds 502 may be designed to be of specific size and composition so that the gap between the two dice 302 and 304 is maintained. For the embodiments, the sections of the wire portions 504 between the two dice 302 and 304 may have sufficient structural integrity to support the weight of the second die 304 as well as any additional downward force that may exist during the package assembly process or post-assembly.

In various embodiments, the first wire bonds that may be coupled to the underlying die (e.g., first die 302 in FIGS. 3A to 6) may be detached wire bonds ("stud bumps"). That is, for these embodiments, the detached wire bonds may only be coupled to the underlying die and may not be coupled to the underlying substrate 306 (note that the underlying substrate 306 may be, for example, a package substrate or another chip or die).

Figure 6:
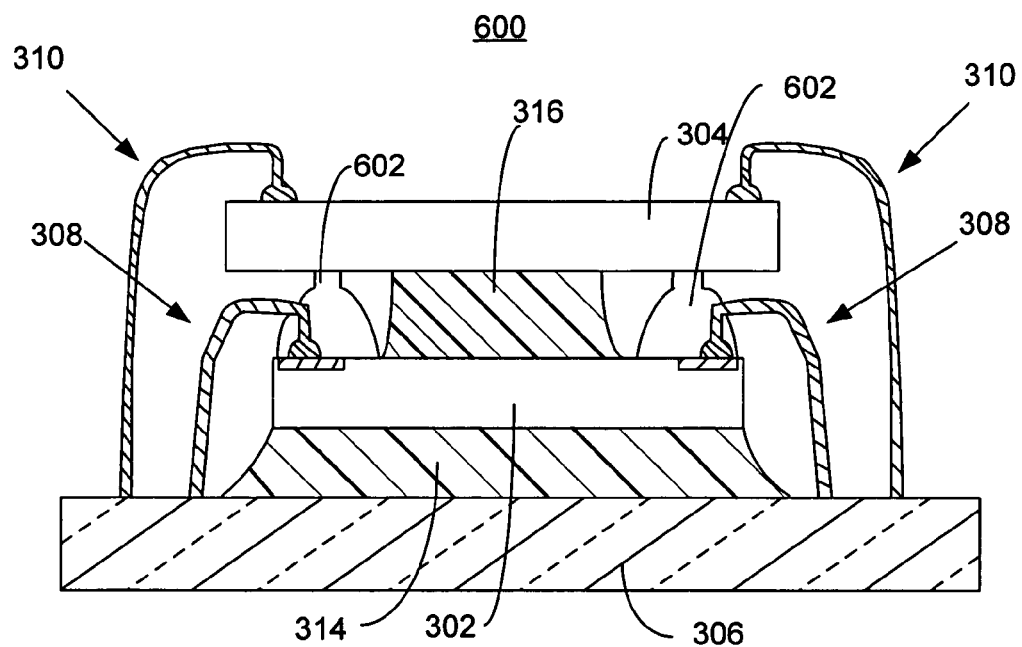
FIG. 6 illustrates a stacked die package having an overlying die that is directly landed on stud bumps of the underlying die and with ball bonds on the underlying die in accordance with some embodiments.

FIG. 6 depicts stacked die package with stud bumps according to some embodiments. For the embodiments, the electronic package 600 incorporates normal wire ball bonding and an adhesive that is disposed between a first and a second die 302 and 304. The second die 304 may be directly landed on top of the stud bumps 602. In various embodiments, at least three stud bumps 602 may be present on top of the first die 302. Although not depicted, note that the stud bumps 602, in some embodiments, may be on top of bond pads on the first die 302. Note further that in these embodiments, the stud bumps 602 are located at the periphery of the top surface (i.e., active surface) of the first die 302 rather than the central portion of the top surface of the first die 302. That is, the stud bumps 602 may be located away from the central portions of the top surface of the first die 302 where circuitry components may be located.

For these embodiments, the presence and the locations of the stud bumps 602 may assure that the gap between the first die 302 and the second die 304 is maintained and that the top (active) surface of the first die 302 is not damaged. Further, the stud bumps 602 may have sufficient structural integrity to support the weight of the second die 304 as well as any additional downward force that may exist during the package assembly process or post-assembly. This may be accomplished in some embodiments and as described previously for the "regular" wire bonds by optimizing the design (e.g., thickness) of the stud bumps 602 and compositions of the stud bumps 602.

In various embodiments, the stud bumps 602 are portions of the bond portions 318 of wire bonds 308 (see FIG. 3B)

and may be formed with dummy wire bonds. For example, in order to form the stud bumps 602, in one embodiment, a standard wire bond may be initially coupled to the top surface of the first die 302. After coupling, all or a portion of the wire portion 320 of the standard wire bond (see FIG. 3B) including the vertical wire shaft 324 may be removed leaving behind only the bond bump 322 and in some cases, at least a portion of the vertical wire shaft 324 on top of the bond bump 322.

In some embodiments, the wire bonds ("dummy wire bonds") used in forming the stud bumps 602 may be bigger and higher than the operational wire bonds (i.e., normal wire ball bonds 308) that may electrically couple the first die 302 to the underlying substrate 306. This may assure that the resulting stud bumps 602 are "taller" than the wire bonds 308. In doing so, the stud bumps 602 may protect the wire bonds 308 from being damaged or warped while supporting the weight of the second die 304 and any additional downward force that may be present during the assembly process of the package or post-assembly.

Figure 7:
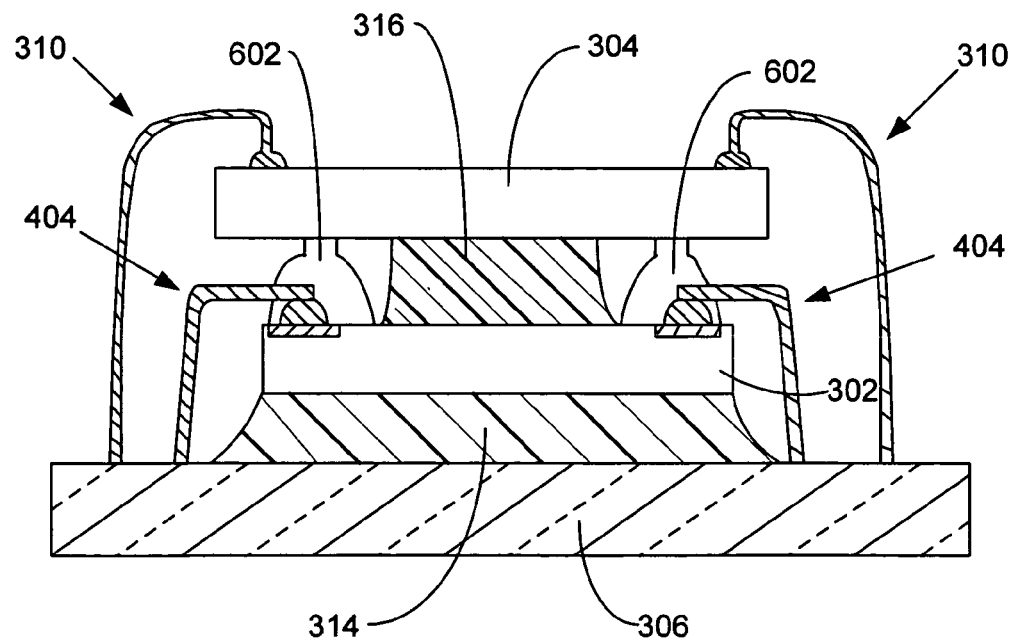
FIG. 7 illustrates a stacked die package having an overlying die that is directly landed on stud bumps of the underlying die and with reverse ball bonds on the underlying die in accordance with some embodiments.
Figure 8:
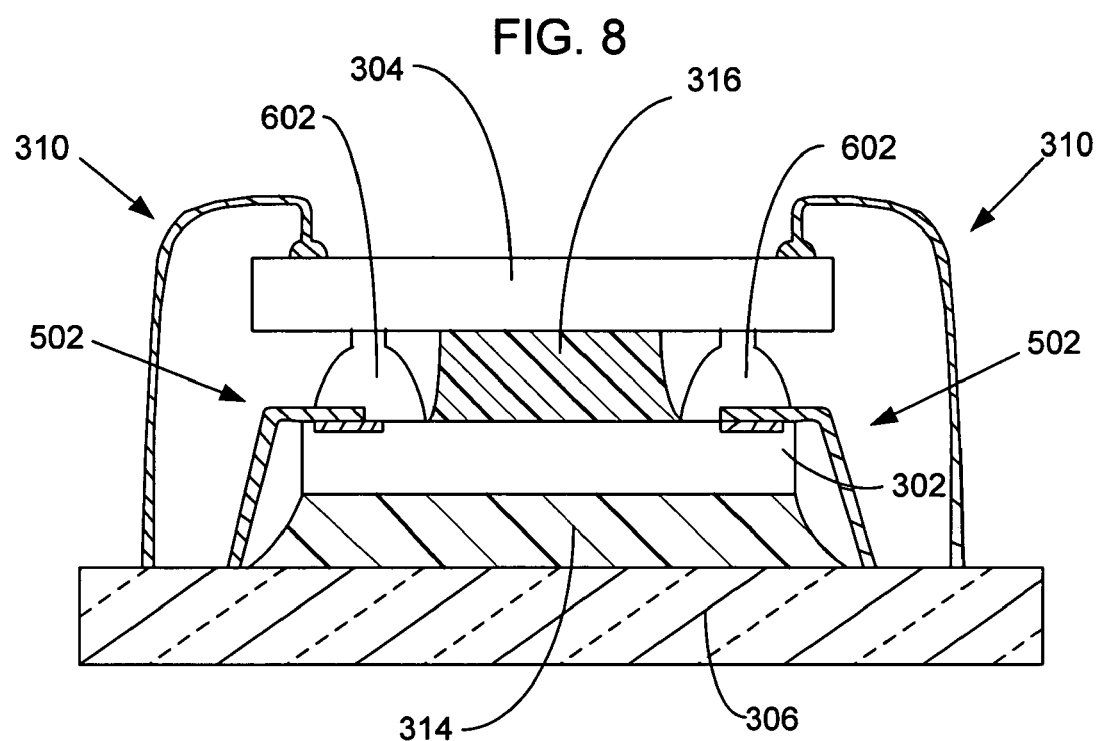
FIG. 8 illustrates a stacked die package having an overlying die that is directly landed on stud bumps of the underlying die and with wedge bonds on the underlying die accordance with some embodiments.

FIGS. 7 and 8 depict stacked chip electronic packages with reverse bonding wire bonding (e.g., wire bonds 404) and wedge bonding wire bonding (e.g., wire bonds 502) and incorporating the stud bumps 602 depicted in FIG. 6. As in the previous embodiments, the stud bumps 602 may be "taller" than the height of portions of the wire bonds 404 and 502 between the first and second dice 302 and 304. As in FIG. 6, nonconductive layer coated on the back of the second die 304 is not required because the wire bonds 308 on the first die 302 may be not in contact with the second die 304.

Figure 9:
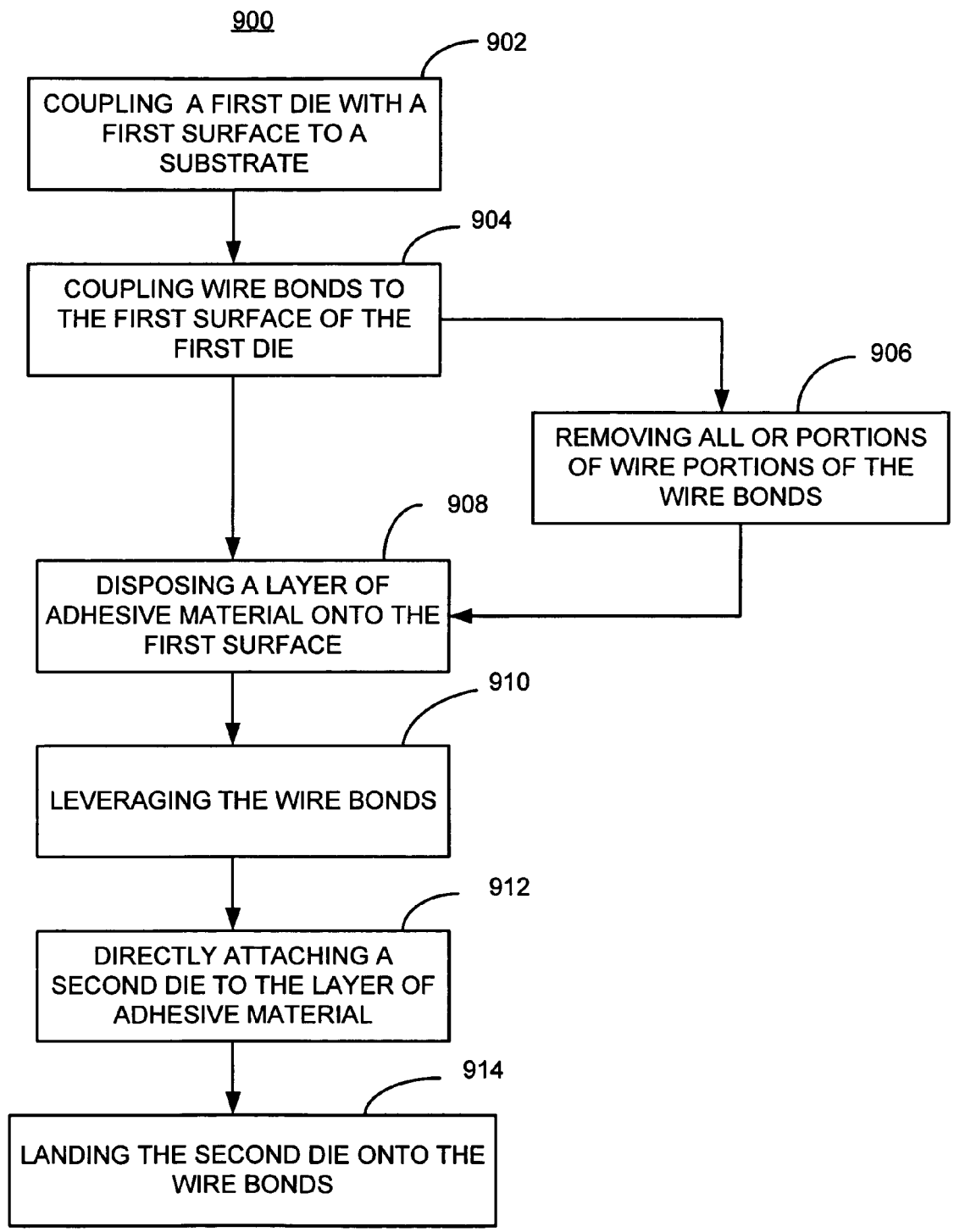
FIG. 9 illustrates a process for forming an electronic package with stacked dice where an overlying die is directly landed on wire bonds of the underlying die.

FIG. 9 depicts a process for forming an electronic package with stacked dice where an overlying die is directly landed on wire bonds of the underlying die without disposing a spacer between the two dice in accordance with some embodiments. For the embodiments, the process 900 may begin when a first die having a first surface is coupled to a substrate or an underlying die, the first surface of the first die being opposite of the substrate at block 902. For the embodiments, the first surface may be the active surface of the first die. In various embodiments, the substrate may be, for example, a package substrate, a circuit board substrate, or another die. Wire bonds may then be coupled to the first surface of the first die at block 904. If the wire bonds are to be used to form stud bumps, then all or at least some portions of the wire portions of the wire bonds may be removed at block 906. Regardless of whether or not the wire portions are removed, an adhesive material in liquid, paste or film form may be disposed on top of the first surface of the first die at block 908. The first or second dice may also be pre-coated with a layer of adhesive. The adhesive material may or may not be in contact with the wire bonds (which may be stud bumps).

Next, the wire bonds (e.g., regular wire bonds or stud bumps) may be leveraged as an optional process to level the highest points of the wire bonds so that the highest points lie approximately on the same flat plane at block 910. This may assure that the second die that is to be landed on top of the wire bonds or the stud bumps is landed properly on the wire bonds. Several approaches may be used for leveraging including, for example, placing a flat surface on top of the wire bonds and applying a downward force to level the wire bonds. Alternatively, this process may be eliminated if the second die that is to be placed on top of the wire bonds is itself used for leveraging. After leveraging the wire bonds, a second die may be directly placed with downward force on the adhesive material at block 912. The liquid/paste adhesive or film adhesive upon heating flow out from between the dice. Finally, the second die may be landed onto one or more of the wire bonds of the first die at block 914. In doing so, at least a portion of the weight of the second die as well as any downward force applied to the second die may be transferred to the wire bonds. Although blocks 912 and 914 are depicted as separate blocks, they may occur at the same time.

Note that one or more of the blocks 902 to 914 illustrated in FIG. 9 may be modified or in a different sequential order than the one depicted in various other embodiments. Further, in some embodiments, one or more of the blocks 902 to 914 may be eliminated from the overall process 900. Yet further, in some embodiments, other block or blocks of operation may be added.

Figure 10:
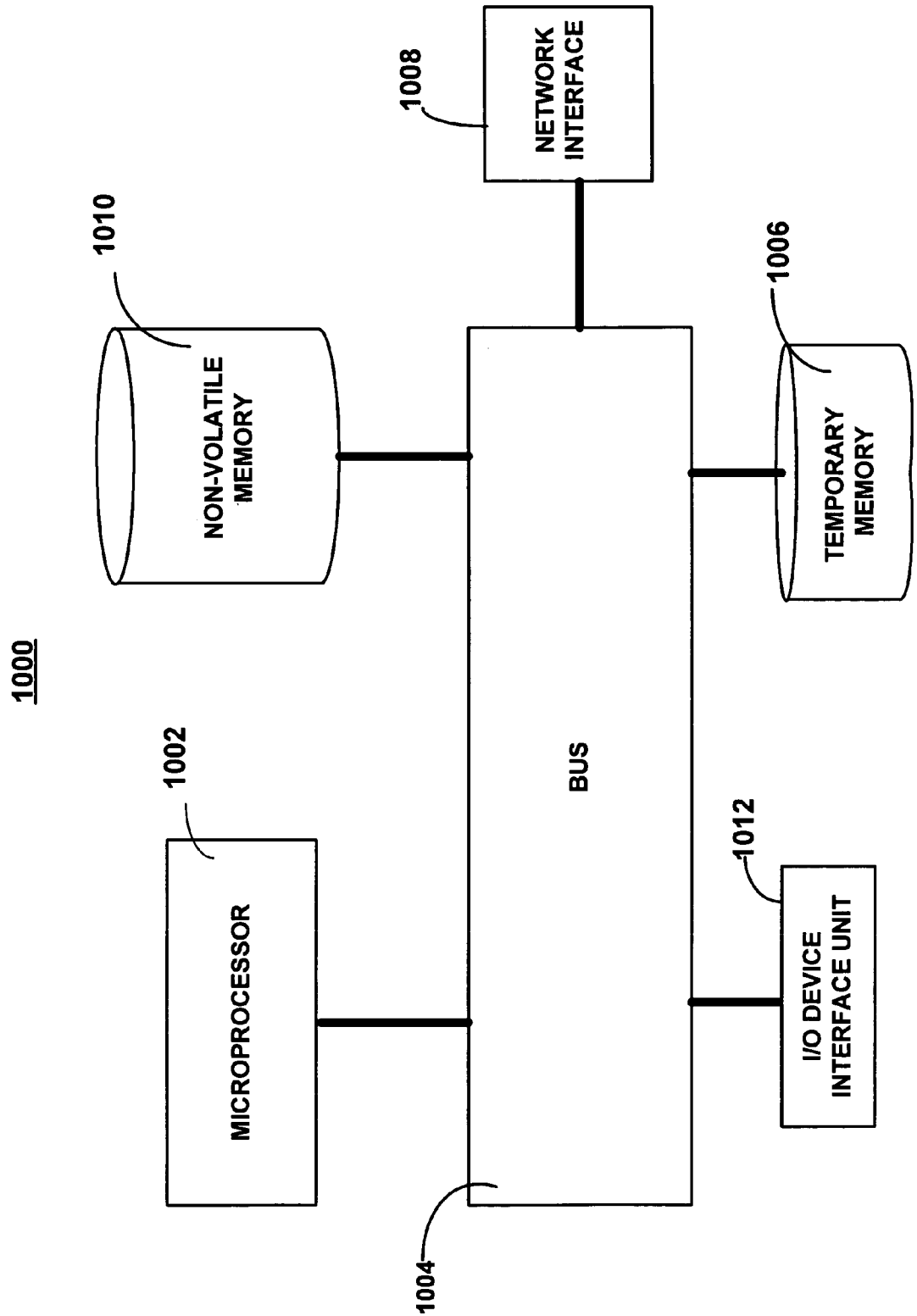
FIG. 10 is a block diagram of an example system, according to some embodiments of the invention.

Referring now to FIG. 10, where a system 1000 in accordance with some embodiments is shown. The system 1000 includes a microprocessor 1002 that may be coupled to a bus 1004. The system 1000 may further include temporary memory 1006, a network interface 1008, an optional non-volatile memory 1010 (such as a mass storage device) and an input/output (I/O) device interface unit 1012. In some embodiments, the input/output device interface unit 1012 may be adapted to interface a keyboard, a cursor control device, and/or other devices. One or more of the above-enumerated elements, such as microprocessor 1002, temporary memory 1006, nonvolatile memory 1010, and so forth, may be included in the stacked-chip package described above.

Depending on the applications, the system 1000 may include other components, including but not limited to chipsets, RF transceivers, mass storage (such as hard disk, compact disk (CD)), digital versatile disk (DVD), graphical or mathematic co-processors, and so forth.

One or more of the system components may be located on a single chip such as a system on chip (SOC). In various embodiments, the system 1000 may be a personal digital assistant (PDA), a wireless mobile phone, a tablet computing device, a laptop computing device, a desktop computing device, a set-top box, an entertainment control unit, a digital camera, a digital video recorder, a media recorder, a media player, a CD player, a DVD player, a network server, or device of the like.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An electronic package, comprising:
   a first die having a first surface and a second surface, the first surface being opposite of the second surface;
   a substrate coupled to the second surface of the first die;
   a plurality of wire bonds coupling a first plurality of bonding pads disposed on the first surface of the first die a second plurality of bonding pads disposed on the substrate, each of the wire bonds extending substantially orthogonally away from a corresponding one of the first bonding pads, and then turning for more than 90 degrees to reach a corrsponding one of the second bonding pads in a manner that provides for at least one highest point of the wire bond to be substantially disposed directly above the corresponding one of the first bonding pads; and a second die having a first surface opposite of a second surface, the second surface of the second die facing the first surface of the first die and landed on the plurality of highest points of the plurality of wire bonds.

2. The electronic package of claim 1, wherein at least portions of the second surface of the second die to couple with the wire bonds comprising of electrical insulation material.

3. The electronic package of claim 2, wherein the electrical insulation material is a material selected from the group consisting of polyimide, Benzocyclobutene (BOB), epoxy, silicon oxide and silicon nitride.

4. The electronic package of claim 1, further comprises of a layer of adhesive material disposed between the first and second dice and directly joined to the first and second surfaces of the first and second dice, respectively.

5. The electronic package of claim 4, wherein the layer of adhesive material comprises of a polymer adhesive with organic or inorganic fillers.

6. The electronic package of claim 4, wherein the wire bonds, the layer of adhesive material and the second die have complementary mechanical strength, adhesiveness, and weight attributes, respectively, where together, results in a force that imparts no negative consequence on structural integrity of the wire bonds, to join the second die with the first die having only the adhesive material between them.

7. The electronic package of claim 4, wherein the mechanical strength, adhesiveness, and weight attributes of the wire bonds, the layer of adhesive material and the second die, complement each other in a manner that results in the second die exerting a force, post-assembly, that imparts no negative consequence on the structural integrity of the wire bonds.

8. The electronic package of claim 1, wherein the first surface is an active surface of the first die.

9. The electronic package of claim 1, wherein the wire bonds comprise a metal selected from the group consisting of gold, aluminum, and copper.

10. The electronic package of claim 1 wherein the first surface of the second die is an active surface.

11. The electronic package of claim 1, wherein the second die is sized about the same or larger than the first die in at least one lateral direction, the at least one lateral direction being parallel to the first and second surfaces.

12. The electronic package of claim 1, wherein the first surface of the first die is smaller or equal to size of the second surface of the second die.

13. The electronic package of claim 1, wherein the substrate is one selected from a group consisting of a package substrate and a third die.

14. The electronic package of claim 1, wherein said wire bonds coated with a nonconductive layer to electrically isolate the wire bonds from the second die.

15. A system, comprising:
an electronic package, including:
a first die having a first surface and a second surface, the first surface being opposite of the second surface;
a substrate coupled to the second surface of the first die;
a plurality of wire bonds coupling a first plurality of bonding pads disposed on the first surface of the first die a second plurality of bonding pads disposed on the substrate, each of the wire bonds extending substantially orthogonally away from a corresponding one of the first bonding pads, and then turning for more than 90 degrees to reach a corresponding one of the second bonding pads in a manner that provides for at least one highest point of the wire bond to be substantially disposed directly above the corresponding one of the first bonding pads; and
a second die having a first surface opposite of a second surface, the second surface of the second die facing the first surface of the first die and landed on the plurality of highest points of the plurality of wire bonds;
a bus coupled to the electronic package; and
a mass storage coupled to the bus.

16. The system of claim 15, wherein at least portions of the second surface of the second die to couple with the wire bonds comprising of electrical insulation material.

17. The system of claim 15, further comprises of a layer of adhesive material disposed between the first and second dice and directly joined to the first and second surfaces of the first and second dice, respectively.

18. The system of claim 15, wherein the system further comprises an input/output device interface unit adapted to interface at least a selected one of a keyboard and a cursor control device.

19. The system of claim 15, wherein the system is a selected one of a set-top box, a digital camera, a CD player, a DVD player, a wireless mobile phone, a tablet computing device, or a laptop computing device.

20. The system of claim 15, wherein said wire bonds coated with a nonconductive layer to electrically isolate the wire bonds from the second die.

* * * * *

UNITED STATES PATENT AND TRADEMARK OFFICE
CERTIFICATE OF CORRECTION

PATENT NO. : 7,166,924 B2  
APPLICATION NO. : 10/921014  
DATED : January 23, 2007  
INVENTOR(S) : Lu et al.

Page 1 of 1

It is certified that error appears in the above-identified patent and that said Letters Patent is hereby corrected as shown below:

In the Drawings Figure 3C  
Reference number "322" should be --350--.

Column 3  
Line 61, "…first adhesive 316…" should read --…second adhesive layer 316…--.

Column 5  
Line 44, "…332" should read --…332.--.

Column 7  
Line 24, "…first die 308…" should read --…first die 302…--.  
Lines 25-26, 27 and 30, "…third die 322…" should read --…third die 350…--.

Signed and Sealed this

Eleventh Day of November, 2008

JON W. DUDAS  
*Director of the United States Patent and Trademark Office*